United States Patent [19]

Shaulov et al.

[11] Patent Number: 4,631,633
[45] Date of Patent: Dec. 23, 1986

[54] THIN FILM CAPACITORS AND METHOD OF MAKING THE SAME

[75] Inventors: Avner A. Shaulov, Monsey; Stanley J. Lukasik, Hawthorn; Myron H. Frommer, Monsey; Walter K. Zwicker, Scarborough, all of N.Y.

[73] Assignee: North American Philips Corporation, New York, N.Y.

[21] Appl. No.: 812,158

[22] Filed: Dec. 23, 1985

[51] Int. Cl.⁴ .................. H01G 3/075; H01G 1/01; H01G 4/10

[52] U.S. Cl. ............................. 361/321; 29/25.42; 427/79

[58] Field of Search ............... 361/321; 29/25.42; 501/134, 136, 137, 138; 427/79

[56] References Cited

U.S. PATENT DOCUMENTS

| | | | |
|---|---|---|---|
| 3,279,947 | 10/1966 | Kaiser | 427/79 X |
| 3,326,718 | 6/1967 | Dill | 29/25.42 X |
| 3,470,018 | 9/1969 | Smith et al. | 427/79 X |
| 3,819,990 | 6/1974 | Hayashi et al. | 29/25.42 X |
| 4,038,167 | 7/1977 | Young | 29/25.42 X |

FOREIGN PATENT DOCUMENTS 147424 11/1981 Japan .................... 427/79

Primary Examiner—Donald A. Griffin
Attorney, Agent, or Firm—Norman N. Spain

[57] ABSTRACT

A thin film capacitor is formed of a thin crystalline electrically insulative or semiconductive substrate. With the insulative substrate a thin conductive metal layer is deposited on the substrate and a thin film of a crystalline strontium barium niobate deposited on the thin conductive metal layer so that its 2.77Å spaced atomic planes are oriented in a non-perpendicular manner to the substrate and an additional thin conductive layer is deposited on the surface of the strontium barium niobate film. When a semiconductive substrate is employed the strontium barium niobate film is deposited directly on the substrate. These capacitors exhibit a low temperature coefficient of capacitance and a high capacitance density.

11 Claims, 4 Drawing Figures

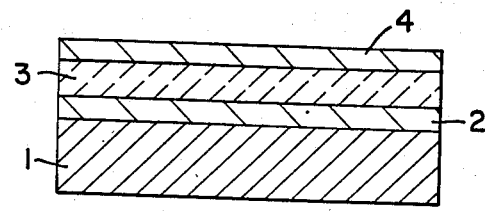
FIG. IA
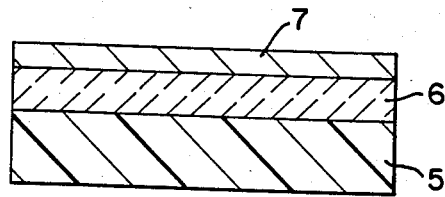
FIG. IB

THIN FILM CAPACITORS AND METHOD OF MAKING THE SAME

BACKGROUND OF THE INVENTION

1. Field of the Invention

This invention relates to thin film capacitors and to a method of making the same.

2. Description of the Prior Art

Thin film capacitors particularly with large capacitive densities and low temperature coefficients of capacitance are highly desired in various areas of microelectronics.

The thin film capacitors employed in microelectronics generally use the dielectrics, such as silicon dioxide, aluminum oxide and tantalum pentoxide. These dielectrics have rather low dielectric constants (about 4 to 20) and therefore the resultant capacitors provide only very moderate capacitance densities. As a result an undesired limitation is placed on the component density of microelectronic circuits employing such capacitors.

Strontium barium niobate crystals of the formula $Sr_{1-x}Ba_x$ where x equals 0.25–0.75 are known materials. These materials are hereinafter called SBN. The crystal structure of SBN has been described in various prior references which include O. F. Dudnik et al, Soviet Physics—Crystallography, Vol. 15, No. 2, September–October 1970, pages 330–332.

SBN crystals have been successfully used as pyroelectric detectors of infrared radiation (see e.g. A. M. Glass, Journal of Applied Physics vol. 40, November 1969, pages 4699–4713). These detectors employ thin wafers of SBN crystals oriented with the electroded surfaces normal to the polarization vector (c - axis). In this form the SBN element acts as a thermal transducer as well as a capacitor. A change in the crystal temperature due to absorbed radiation power alters its temperature and causes a voltage to develop across the parallel plate capacitor through the pyroelectric effect. For this application the SBN wafers are cut normal to the polarization vector (c axis) in order to maximize the pyroelectric effect. In this orientation, however, the capacitance of the SBN element varies strongly with temperature. Wafers cut parallel to the c - axis show a weak temperature dependence of capacitance, however, such wafers are not useful as infrared detectors because they do not exhibit the pyroelectric effect.

Certain features of dielectric characteristics of SBN films produced in RF sputtering in an oxygen atmosphere are described in the article by V. J. Zhdanov et al, Ferroelectrics, 1980, Vol. 29, pages 219–220. On page 219 of the Zhdanov et al article it is stated that by RF sputtering at an oxygen pressure of $6-9 \times 10^{-3}$ Torr there are formed SBN films "the value $\epsilon$ immediately after manufacturing is insensitive to temperature change over a wide range". However, the Zhdanov et al article indicates also that upon cooling from the temperature employed during sputtering (700° C.–900° C.) the dielectric constant $\epsilon$ of these SBN film decreases with a decrease in temperature.

Yazaki et al, U.S. Pat. No. 3,823,998 shows a light valve comprising a single crystal plate of SBN as an optically active material and bearing on its major surfaces parallel rows of the conductive strips, the strips on one surface intersecting the strips on the other surface. There is no indication in the Yazaki et al patent that the structure formed by the combination of the crystal and the transparent electrode strips forms a capacitor having a high capacitance density and a low temperature coefficient of capacitance.

GB Patent No. 905253 shows a laminated capacitor comprising a semicrystalline ceramic dielectric having a high dielectric constant. An example of such a dielectric being a semi-crystalline glass containing, besides silicon dioxide, barium niobate and strontium niobate. See, for example, glass composition 88 Table 6, page 16. In FIG. 6 of this patent it is shown that the temperature coefficient of the dielectric constant for this material (88) is quite high.

SUMMARY OF THE INVENTION

A principal object of this invention is to provide a thin film capacitor comprising a high capacity along with a low temperature coefficient of capacitance. Other objects of the invention will be apparent from the description that follows.

According to the invention, a novel film capacitor having a high capacitance density along with a low temperature coefficient of capacitance is produced.

Further, according to one aspect of the invention in this novel capacitor a thin crystalline electrically insulative substrate is provided on one surface with the thin crystalline film of a conductive metal. Additionally, a thin film of crystalline SBN of the formula $Sr_{1-x}Ba_x Nb_2O_6$ wherein $25 \leq x \leq 75$ and having 2.77 Å spaced atomic planes oriented in a non-perpendicular manner to the surface of the thin crystalline substrate is provided on the other surface of the thin crystalline film of the conductive metal and an additional film of conductive metal is provided on the other surface of the thin film of crystalline SBN.

According to another aspect of the invention in the novel capacitor a thin crystalline semiconductive substrate is provided on one surface with a thin film of crystalline SBN as described and a film of conductive metal is provided on the other surface of the thin film of crystalline SBN.

The novel capacitors of the instant invention have been found to exhibit a high density of capacitance along with a low temperature coefficient of capacitance and a low temperature coefficient of dissipation factor particularly at frequencies of 10 KHz and above.

According to still further aspects of the invention, the novel thin film capacitor of the invention is produced by a novel combination of steps. When the substrate employed is an electrically insulative substrate, the method involves first forming by RF sputtering in an inert gas atmosphere a thin crystalline film of a conductive metal on a surface of a thin crystalline electrically insulative substrate, depositing by RF sputtering in an atmosphere of a mixture of about 50% of oxygen and about 50% of an inert gas a thin crystalline film of SBN having 2.77 Å spaced atomic planes oriented in a non-perpendicular manner to the surface of this substrate on the film of conductive metal and then depositing on the free surface of the resultant crystalline film of the SBN, by RF sputtering, in an inert gas atmosphere a thin film of a conductive metal.

When a semiconductive substrate is employed the method involves first forming by RF sputtering in an atmosphere of a mixture of 50% oxygen and about 50% of an inert gas a thin crystalline film of SBN on a surface of a thin crystalline semiconductive substrate, the SBN film having 2.77 Å spaced atomic planes oriented in a non-perpendicular manner to said surface and then depositing, by RF sputtering in an inert gas atmosphere a thin film of a conductive metal on the free surface of the resultant film of SBN.

BRIEF DESCRIPTION OF THE DRAWINGS

FIG. 1A of the drawing is a cross-sectional view of a thin film capacitor of the invention.

FIG. 1B of the drawing is a cross-sectional view of an additional thin film capacitor of the invention.

DESCRIPTION OF THE PREFERRED EMBODIMENTS

Figure 2:
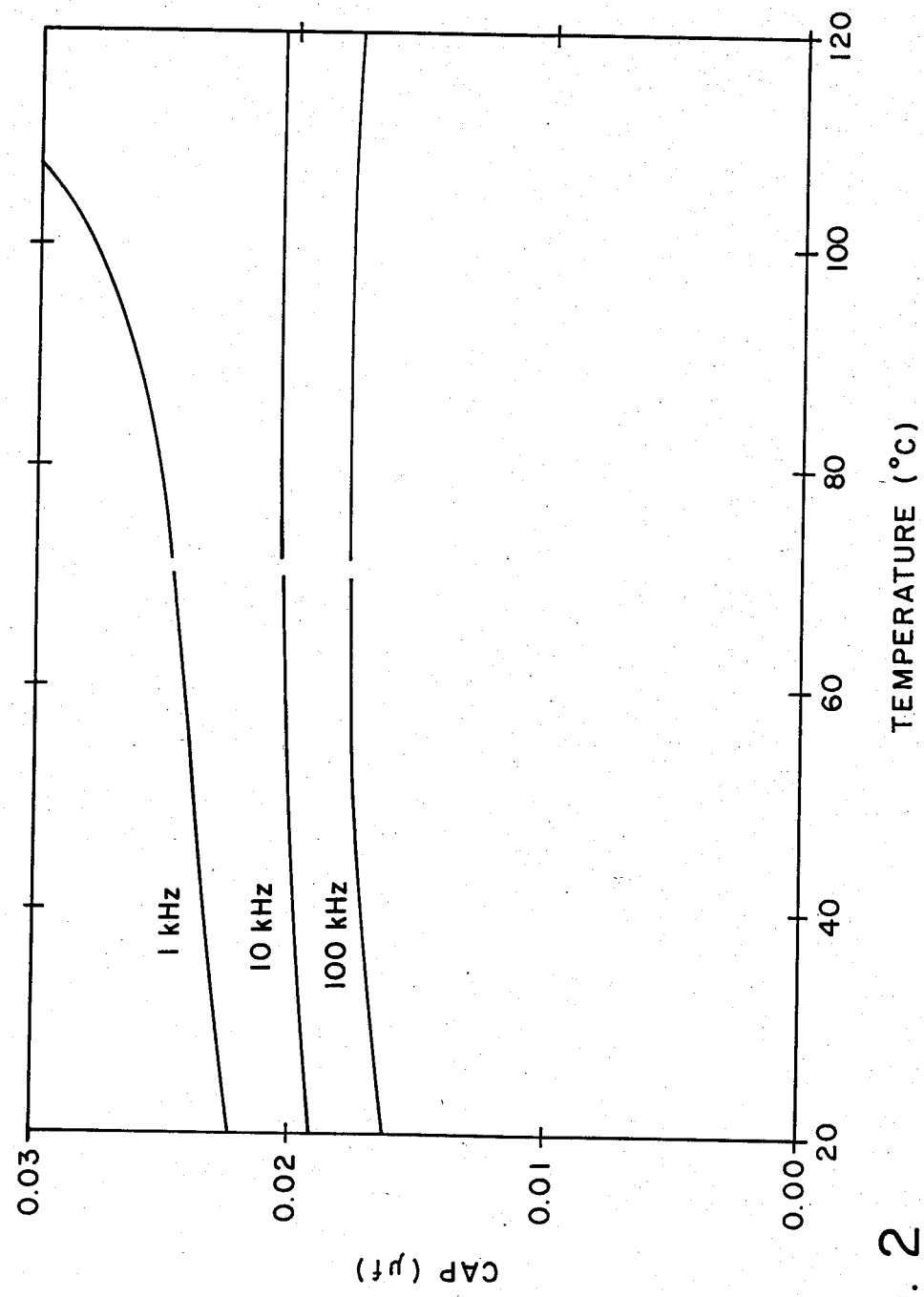
FIG. 2 of the drawing is a graph showing the variation of capacitance with temperatures at various frequencies for a capacitor of the invention.

For better understanding, the invention will now be described in greater detail, with reference to the following examples and to the drawing.

EXAMPLE 1

1$\bar{1}$02 oriented sapphire discs, 25 mm in diameter and 1 mm thick were cleaned by soaking at room temperature aqua regia, rinsed in distilled water and then rinsed in isopropanol and dried in a stream of UHP nitrogen. A first electrode of a thin platinum crystalline film was then deposited by RF sputtering in an UHP argon in a vacuum system with a pressure of about $4 \times 10^{-3}$ Torr. The deposited platinum film was then allowed to cool in vacuum.

A thin crystalline film of $Sr_{0.75}Ba_{0.25}N_2O_6$ (SBN) was then deposited by RF sputtering in four steps in the following manner employing in each step a background pressure of about $4 \times 10^{-3}$ Torr.

The metallized discs were heated to about 700° C. in a vacuum and then about a 50/50 mixture of UHP argon and oxygen was admitted to a pressure of about $1.4 \times 10^{-3}$ Torr. An SBN target was then RF sputtered with a sputtering time of one hour for each of the first two steps and then the discs were rotated 90° before the last two sputtering steps which took 1.5 hours each. After each of the sputtering steps, the discs were allowed to cool slowly to near room temperature in pure argon and then allowed to rest in the vacuum. Before each of the last three sputtering steps the previously deposited SBN was sputter etched at room temperature in pure argon to clean up the interface after which the discs were heated to 700° C. and the argon/oxygen gas mixture was introduced. The total time of the SBN deposition was 5 hours.

The counter electrode consisting also of a thin film of platinum was RF sputtered through a sapphire mask with 1/16th inch holes. This film was deposited in a similar fashion to the first electrode except that the SBN surface was sputter etched in pure argon before the platinum film was deposited.

As shown in FIG. 1A of the drawing, a thin film capacitor produced according to this example consists of a thin sapphire disc 1 of a thickness of about 2 mm having upon one surface a thin crystalline platinum film electrode 2 of a thickness of 4500 Å. On the surface of this thin film platinum electrode 2 a thin SBN film 3 of a thickness of 5500 Å is present and on the surface of this thin SBN film 3, located away from the thin crystalline platinum film electrode 2, there is a thin counter film platinum electrode 4 of a thickness of 6200 Å.

X-ray diffraction analysis of the SBN film showed that this film had atomic planes spaced from each other at about 2.77 Å and that these planes are non-perpendicularly oriented to the plane of the surface of the sapphire disc.

The capacitance and dissipation (loss) of the capacitors were measured as a function of frequency and temperature.

The values of the capacitance and dissipation (loss) at 25° C. for a sample capacitor produced according to the example are shown in Table 1:

TABLE 1

| Frequency (kHz) | Capacitance (nF) | Dissipation Factor (%) |
| --- | --- | --- |
| 1 | 22.3 | 13.6 |
| 10 | 19.1 | 18.6 |
| 100 | 16.1 | 11.4 |
| 1000 | 13.5 | 12.4 |

As will be noted, Table 1 shows that this capacitor has large capacitance values which increase inversely with frequency and a relatively low dissipation factor of about 11.4 to about 18.6 n at 25° C.

The relation of the capacitance to the temperature of a capacitor prepared in accordance with the example at various frequencies is shown in the graph of FIG. 2. As shown in this graph, at frequencies of 10 and 100 KHz, this capacitor has a very low temperature coefficient of capacitance, while at a frequency of 1 KHz there is a slight gradual increase in the capacitance from about 20° to 70° C. and then a more rapid increase in capacitance to about 105° C. indicating a somewhat higher temperature coefficient of capacitance.

Figure 3:
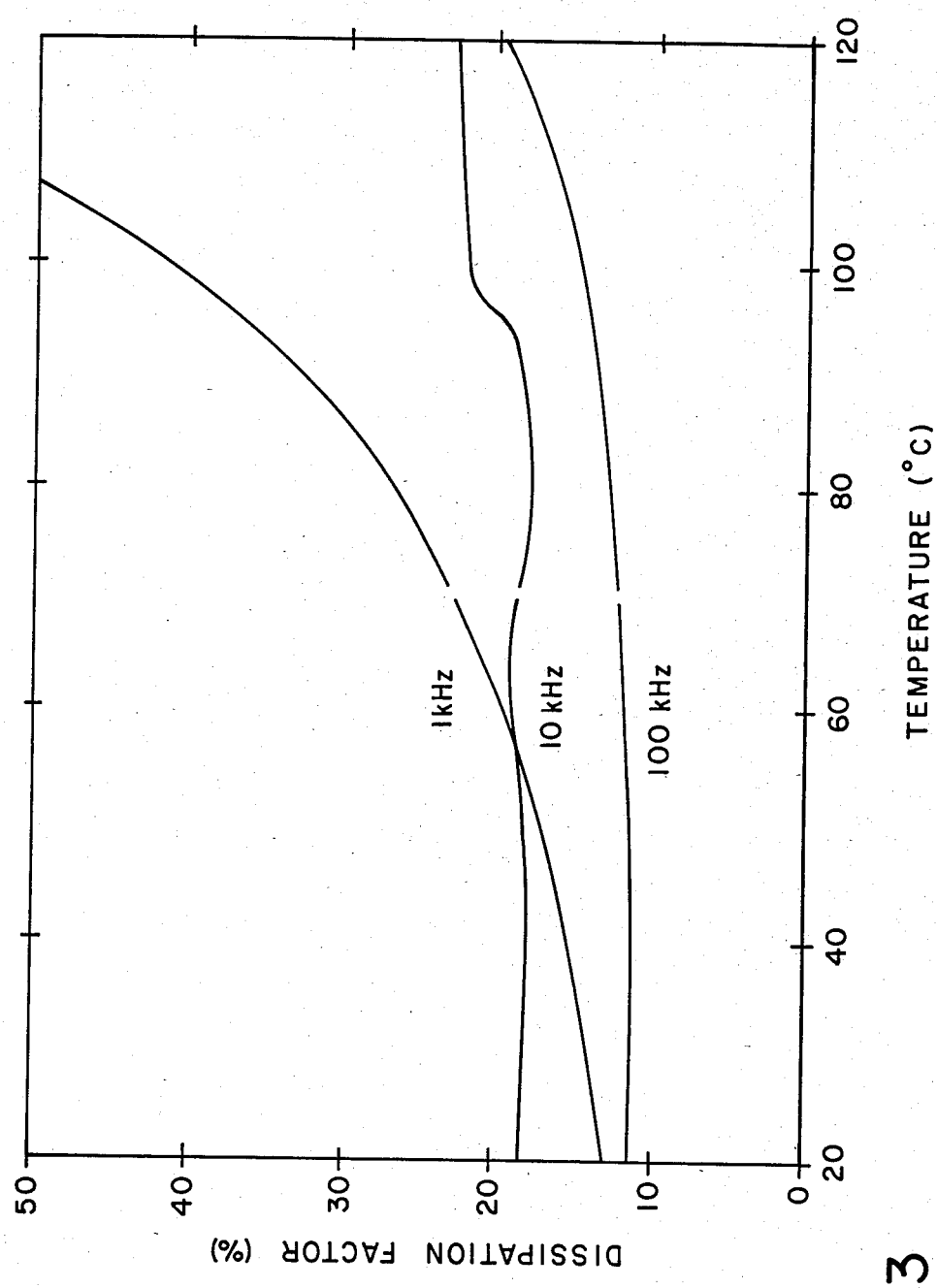
FIG. 3 is a graph showing the dissipation factor for the same capacitor at the same temperature range and frequencies.

The dissipation factor was also determined for the same capacitor at the same frequencies and at the same temperature range (20°–120° C.) and this relation is shown in the graph of FIG. 3.

As shown in this graph, the dissipation factor varies from about 11% to about 20% at a frequency of 100 KHz and from about 18% at a temperature of 20° C. to about 23% at a temperature of 120° C. with a dip to about 15% in a range of about 80° C. at a frequency of 10 KHz. However, at a frequency of 1 KHz the dissipation factor varies from about 13% at 20° C. to 50% at a temperature of about 110° C.

While the thin film electrodes in the example were formed of platinum other conductive metals such as gold or nickel-chrome may be employed.

These electrode are preferably about 500 Å-1 micron thick.

EXAMPLE 2

In another example in place of the sapphire disc a semiconductive 111 oriented silicon substrate doped with boron and of similar dimensions was employed. A thin crystalline film of SBN was deposited on a surface of the silicon substrate. This deposition was carried out in a manner similar to that described in the previous example. A thin film of platinum was then deposited on the free surface of the resultant crystalline film of SBN in a manner also similar to that described in the previous example.

The thin film capacitor produced according to this example, as shown in FIG. 1B, consists of a thin semiconductive boron doped silicon substrate 5 of a thickness of about 2 mm having upon one surface a thin SBN layer 6 of a thickness of about 5500 Å and on the surface of the SBN layer away from the substrate a thin counter platinum electrode 7 of a thickness of 6200 Å.

The resultant capacitor showed a slightly higher temperature dependency and similar capacitance values as compared to the capacitor of the previous example.

The thickness of the thin films of SBN is preferably about 0.05–10 microns thick. Preferably the thickness of the substrate should be about 0.3 mm to 3 mm.

While the present invention has been described with references to particular embodiments thereof, it will be understood that numerous modifications can be made by those skilled in the art without actually departing from the scope of the invention.

What we claim is:

1. A thin film capacitor having a low temperature coefficient of capacitance and a high capacitance density, said capacitor consisting essentially of a thin crystalline electrically insulative substrate, a first thin crystalline film of a conductive metal situated on a surface of said thin substrate, a thin film of crystalline strontium barium niobate having a composition of the formula $Sr_{1-x}Ba_xNb_2O_6$ wherein $25 \leq x \leq 75$ and having 2.77 Å spaced atomic planes oriented non-perpendicularly to said surface of said thin substrate situated on said first crystalline film of a conductive metal and a second thin film of a conductive metal situated on the surface of said crystalline film of strontium barium niobate.

2. The thin film capacitor of claim 1 wherein the thin crystalline substrate is a thin crystalline aluminum oxide substrate.

3. The thin film capacitor of claim 1 wherein said first and said second films of conductive metal are films of platinum, gold or nickel-chrome.

4. The thin film capacitor of claim 2 wherein said first and said second films of conductive metal are films of platinum, gold or nickel-chrome.

5. The thin film capacitor of claim 4 wherein the substrate is a thin sapphire plate.

6. The thin film capacitor of claim 3 wherein the thickness of the aluminum oxide substrate is about 0.3–3 mm.

7. The thin film capacitor of claim 6 wherein the thickness of the strontium barium niobate film is about 0.05–10 microns.

8. A thin film capacitor having a low temperature coefficient of capacitance and a high capacitance density, said capacitor consisting essentially of a thin crystalline semiconductor substrate, a thin film of crystalline strontium niobate having a composition of the formula $Sr_{1-x}Ba_xNb_2O_6$ wherein $25 \leq x \leq 75$ and having 2.77 Å spaced atomic planes oriented non-perpendicularly to said surface of said thin substrate and a thin film of conductive metal situated on the surface of said thin film of crystalline strontium barium niobate.

9. The thin film capacitor of claim 8 wherein said semiconductor substrate is a semiconductive crystalline silicon substrate.

10. A method of producing a thin film capacitor having a low temperature coefficient of capacitance and a high capacitance density, said method comprising depositing by rf sputtering in an inert gas atmosphere a first conductive thin crystalline metal film on a surface of a thin inorganic crystalline electrically insulative substrate, depositing on the surface of said first metal film, by rf sputtering in an atmosphere of about a 50/50 mixture of oxygen and an inert gas, a thin crystalline film of a strontium barium niobate of the formula $Sr_{1-x}Ba_xNb_2O_6$ wherein $25 \leq x \leq 75$ and having 2.77 Å spaced atomic planes oriented in a non-perpendicular manner to the surface of said substrate and then depositing by rf sputtering in an inert gas atmosphere a second thin conductive crystalline metal film on the surface of said strontium barium niobate film.

11. A method of producing a thin film capacitor having a low temperature coefficient of capacitance and a high capacitance density, said method comprising depositing by rf sputtering in an atmosphere of about a 50/50 mixture of oxygen and an inert gas, a thin crystalline film of a strontium barium niobate of the formula $Sr_{1-x}Ba_xNb_2O_6$ wherein $25 \leq x \leq 75$ and having 2.77 Å spaced atomic planes oriented in a non-perpendicular manner to the surface of said substrate and then depositing by rf sputtering in an inert gas atmosphere a second thin conductive crystalline metal film on the surface of said strontium barium niobate film.

* * * * *